US006124079A

United States Patent [19]

Vermeersch et al.

[11] Patent Number: 6,124,079

[45] Date of Patent: Sep. 26, 2000

[54] METHOD FOR MAKING A DRIOGRAPHIC PRINTING PLATE INVOLVING THE USE OF A HEAT-SENSITIVE IMAGING ELEMENT

[75] Inventors: Joan Vermeersch, Deinze; Marc Van Damme, Heverlee, both of Belgium

[73] Assignee: Agfa-Gevaert, N.V., Mortsel, Belgium

[21] Appl. No.: 09/453,341

[22] Filed: Dec. 2, 1999

Related U.S. Application Data

[62] Division of application No. 08/916,786, Aug. 25, 1997.
[60] Provisional application No. 60/031,139, Nov. 18, 1996.

[30] Foreign Application Priority Data

Sep. 25, 1996 [EP] European Pat. Off. .............. 96202685

[51] Int. Cl.[7] ...................... G03F 7/004
[52] U.S. Cl. ...................... 430/303; 101/467
[58] Field of Search ...................... 430/303, 273.1, 430/272.1, 944, 945; 101/455, 467

[56] References Cited

U.S. PATENT DOCUMENTS

| | | | |
|---|---|---|---|
| 4,004,924 | 1/1977 | Vrancken et al. | 96/35 |
| 4,826,752 | 5/1989 | Yoshida et al. | 430/155 |
| 5,378,580 | 1/1995 | Leenders | 430/303 |
| 5,871,883 | 5/1999 | Hirano et al. | 430/272.1 |
| 5,919,600 | 7/1999 | Huang et al. | 430/272.1 |
| 5,968,709 | 10/1999 | Verschueren et al. | 430/272.1 |
| 5,985,515 | 11/1999 | Van Rompuy et al. | 430/272.1 |

FOREIGN PATENT DOCUMENTS

| | | |
|---|---|---|
| 573 092 | 12/1993 | European Pat. Off. . |
| 601 236 | 6/1994 | European Pat. Off. . |
| 770 494 | 5/1997 | European Pat. Off. . |

*Primary Examiner*—Janet Baxter
*Assistant Examiner*—Barbara Gilmore
*Attorney, Agent, or Firm*—Breiner & Breiner

[57] ABSTRACT

According to the present invention there is provided a method for making driographic printing plates comprising the image-wise exposure of a heat-sensitive recording material comprising on an ink-accepting support an image-forming layer containing nydrofobic thermoplastic polymer particles and a compound capable of converting light into heat, said compound being present in said image-forming layer or a layer adjacent thereto and a cured ink-repellant surface layer. After the exposure the printing plate is developed by wiping it with water or an aqueous solution before or after mounting it on the print cylinder of a printing press.

9 Claims, No Drawings

METHOD FOR MAKING A DRIOGRAPHIC PRINTING PLATE INVOLVING THE USE OF A HEAT-SENSITIVE IMAGING ELEMENT

This is a division of application Ser. No. 08/916,786 filed Aug. 25, 1997, which claims priority to provisional application Ser. No. 60/031,139 filed Nov. 18, 1996.

Priority of European application Serial No. 96202685.2 filed on Sep. 25, 1996 is claimed under 35 U.S.C. §119. The certified copy has been filed on Oct. 22, 1998 in prior U.S. application Ser. No. 08/916,786.

1. Field of the Invention

The present invention relates to a method for making a driographic printing plate involving the use of a heat-sensitive imaging element developable by means of plain water or an aqueous solution.

2. Background of the Invention

Lithographic printing is the process of printing from specially prepared surfaces, some areas of which are capable of accepting ink, whereas other areas will not accept ink.

In the art of photolithography, a photographic material is made imagewise receptive to oily or greasy ink in the photo-exposed (negative working) or in the non-exposed areas (positive working) on a ink-repelling background.

In the production of common lithographic plates, also called surface lithoplates or planographic printing plates, a support that has affinity to water or obtains such affinity by chemical treatment is coated with a thin layer of a photosensitive composition. Coatings for that purpose include light-sensitive polymer layers containing diazo compounds, dichromate-sensitized hydrophilic colloids and a large variety of synthetic photopolymers. Particularly diazo-sensitized systems are widely used.

Upon imagewise exposure of such light-sensitive layer the exposed image areas become insoluble and the unexposed areas remain soluble. The plate is then developed with a suitable liquid to remove the diazonium salt or diazo resin in the unexposed areas.

On the other hand, methods are known for making printing plates involving the use of imaging elements that are heat-sensitive rather than photosensitive. A particular disadvantage of photosensitive imaging elements such as described above for making a printing plate is that they have to be shielded from the light. Furthermore they have a problem of stability of sensitivity in view of the storage stability and they show a lower resolution. The trend towards heat-sensitive printing plate precursors is clearly seen on the market.

For example, Research Disclosure no. 33303 of January 1992 discloses a heat-sensitive imaging element comprising on a support a cross-linked hydrophilic layer containing thermoplastic polymer particles and an infrared absorbing pigment such as e.g. carbon black. By image-wise exposure to an infrared laser, the thermoplastic polymer particles are image-wise coagulated thereby rendering the surface of the imaging element at these areas ink acceptant without any further development. A disadvantage of this method is that the printing plate obtained is easily damaged since the non-printing areas may become ink-accepting when some pressure is applied thereto. Moreover, under critical conditions, the lithographic performance of such a printing plate may be poor and accordingly such printing plate has little lithographic printing latitude.

EP-A-514145 discloses a heat-sensitive imaging element including a coating comprising core-shell particles having a water insoluble heat softenable core component and a shell component which is soluble or swellable in aqueous alkaline medium. Red or infrared laser light directed image-wise at said imaging element causes selected particles to coalesce, at least partially, to form an image and the non-coalesced particles are then selectively removed by means of an aqueous alkaline developer. Afterwards a baking step is performed. However the printing endurance of a so obtained printing plate is low.

EP-A-599510 discloses a heat-sensitive imaging element which comprises a substrate coated with (i) a layer which comprises (1) a disperse phase comprising a water-insoluble heat softenable component A and (2) a binder or continuous phase consisting of a component B which is soluble or swellable in aqueous, preferably aqueous alkaline medium, at least one of components A and B including a reactive group or precursor therefor, such that insolubilisation of the layer occurs at elevated temperature and/or on exposure to actinic radiation, and (ii) a substance capable of strongly absorbing radiation and transferring the energy thus obtained as heat to the disperse phase so that at least partial coalescence of the coating occurs. After image-wise irradiation of the imaging element and developing the image-wise irradiated plate, said plate is heated and/or subjected to actinic irradiation to effect insolubilisation. However the printing endurance of a so obtained printing plate is low.

Furthermore EP-A 952022871.0, 952022872.8, 952022873.6 and 952022874.4 disclose a method for making a lithographic printing plate comprising the steps of (1) image-wise exposing to light a heat-sensitive imaging element comprising (i) on a hydrophilic surface of a lithographic base an image forming layer comprising hydrophobic thermoplastic polymer particles dispersed in a hydrophilic binder and (ii) a compound capable of converting light to heat, said compound being comprised in said image forming layer or a layer adjacent thereto; (2) and developing a thus obtained image-wise exposed element by rinsing it with plain water. During the exposure of such an imaging element the imaging element shows partially ablation resulting in a deterioration of the lithographic properties of a so obtained lithographic plate e.g. a decreased ink acceptance on said ablated areas.

Driographic printing plates comprise highly ink-repellant areas and ink-accepting areas which are commonly formed by a silicon layer. These printing plates operate without the use of a dampening liquid. Driographic printing plates can be prepared using a photographic material that is made image-wise receptive or repellant to ink upon photo-exposure of the photographic material. Also heat-sensitive recording materials are known for preparing driographic printing plates. The surface of these heat-sensitive printing plates can be made image-wise receptive or repellant to ink upon image-wise exposure to heat and/or subsequent development.

For example in DE-A-2512038 there is disclosed a heat mode recording material that comprises on a support carrying or having an ink-accepting surface (i) a heat mode recording layer containing a self oxidizing binder e.g. nitrocellulose and a substance that is capable of converting radiation into heat e.g. carbon black and (ii) a non-hardened silicon layer as a surface layer. The disclosed heat mode recording material is image-wise exposed using a laser and is subsequently developed using a developing liquid that is capable of dissolving the silicon layer in the exposed areas. Subsequent to this development the silicon surface layer is cured. Due to the use of naphta as a developing liquid the process is ecologically disadvantageous. Further since the surface layer is not hardened the heat mode recording material may be easily damaged during handling.

FR-A-1.473.751 discloses a heat mode recording material comprising a substrate having an ink-accepting surface, a layer containing nitrocellulose and carbon black and a silicon layer. After image-wise exposure using a laser the imaged areas are said to be rendered ink-accepting. The decomposed silicon layer is not removed. Ink-acceptance of the obtained plates is poor and the printing properties such as printing endurance and resolution of the copies is rather poor.

Research Disclosure 19201 of April 1980 discloses a heat mode recording material comprising a polyester film support provided with a bismuth layer as a heat mode recording layer and a silicon layer on top thereof. The disclosed heat mode recording material is imaged using an argon laser and developed using hexane.

Furthermore EP-A-573091 discloses a heat mode recording material comprising a substrate having an ink-accepting surface, a recording layer containing a light-to-heat converting compound and a silicone layer. After image-wise exposure using a laser beam the exposed areas are rubbed to remove said ink-repellant surface layer and recording layer.

EP-A-580393 (U.S. Pat. No. 5,339,737) discloses a heat-sensitive material comprising a first and second layer, said first layer is a silicone layer containing an IR-absorbing compound and the first and second layer exhibit different affinities towards a printing liquid (ink and/or adhesive liquid for ink). The lithographic printing plate is imaged by a laser and after exposure the ablated parts are removed in a post-imaging cleaning step.

In the latter discussed systems contamination of the exposure unit and of the printing plate can occur with debris from the laser ablated areas. Also development on the printing press is not likely with this type of printing plates.

The above discussed heat-sensitive systems are mostly developed with ecologically harmful solvents and/or are not suitable for driography and/or have poor printing properties. Thus there is still a need for a heat-sensitive recording material that can easily be processed and that yields printing plates with good or excellent printing properties.

SUMMARY OF THE INVENTION

It is an object of the present invention to provide a heat-sensitive imaging element for making driographic printing plates with excellent printing properties, developable in a convenient ecological way.

It is further an object of the present invention to provide a method for making a driographic printing plate of high quality using a heat-sensitive imaging material that can be developed in a convenient ecological way.

Further objects of the present invention will become clear from the description hereinafter:

According to the present invention there is provided a heat-sensitive imaging element comprising on a support, having an ink-accepting surface, an image forming layer, a compound capable of converting light into heat present in said image forming layer or in a layer adjacent thereto and a cured ink-repellant surface layer, characterized in that said image forming layer comprises hydrophobic thermoplastic polymer particles.

Further this invention also provides a method for making a lithographic printing plate comprising the steps of:

- image-wise or information-wise exposing to light or heat an imaging element as defined above
- developing said exposed imaging element with a developing solution in order to remove the unexposed areas and thereby form a lithographic printing plate.

DETAILED DESCRIPTION OF THE INVENTION

It has been found that according to the method of the present invention using an imaging element as described above, lithographic printing plates of high quality with a high printing endurance can be obtained. Said printing plates are of high quality and are provided in an ecologically acceptable way.

According to a preferred embodiment of the present invention a heat-sensitive recording material is provided comprising on an ink-accepting support, a heat-sensitive layer containing hydrophobic thermoplastic polymer particles and a light-to-heat converting compound and an ink-repellant surface layer.

According to the present invention the ink-repellant surface layer preferably contains a hardened silicone coating. Preferably the silicone coating contains one or more components one of which is generally a linear silicone polymer terminated with a chemically reactive group at both ends and a multifunctional component as a hardening agent. The silicone coating can be hardened by condensation curing, addition curing or radiation curing.

Condensation curing can be performed by using a hydroxy terminated polysiloxane that can be cured with a multifunctional silane. Suitable silanes are e.g. acetoxy silanes, alkoxy silanes and silanes containing oxime functional groups. Generally the condensation curing is carried out in the presence of one or more catalyst such as e.g. tin salts or titanates. Alternatively hydroxy terminated polysiloxanes can be cured with a polyhydrosiloxane polymer in the presence of a catalyst e.g. dibutyltindiacetate.

Addition curing is based on the addition of Si—H to a double bond in the presence of a platinum catalyst. Silicone coatings that can be cured according to the addition curing thus comprise a vinyl end-groups containing polymer, a platinum catalyst e.g. chloroplatinic acid complexes and a polyhydrosiloxane e.g. polymethylhydrosiloxane. Suitable vinyl group containing polymers are e.g. vinyldimethyl terminated polydimethylsiloxanes and dimethylsiloxane/vinylmethyl siloxane copolymers.

Radiation cure coatings that can be used in accordance with the present invention are e.g. U.V. curable coatings containing polysiloxane polymers containing epoxy groups or electron beam curable coatings containing polysiloxane polymers containing (meth)acrylate groups. The latter coatings preferably also contain multifunctional (meth)acrylate monomers.

The ink-repellant surface layer has in accordance with the present invention preferably a thickness of at least 0.5 $\mu$m and more preferably at least 1.0 $\mu$m. The maximum thickness of the surface layer is not critical but will preferably be not more than 5 $\mu$m and more preferably not more than 2.5 $\mu$m.

According to one embodiment of the present invention, the ink-accepting support can be aluminum e.g. electrochemically and/or mechanically grained and anodised aluminum.

According to another embodiment in connection with the present invention, the ink-accepting support can comprise a flexible support, such as e.g. paper or plastic film, provided with a crosslinked hydrophilic layer. A particularly suitable cross-linked rough hydrophilic layer may be obtained from a hydrophilic binder cross-linked with a cross-linking agent such as formaldehyde, glyoxal, polyisocyanate or preferably a hydrolysed tetra-alkylorthosilicate.

As hydrophilic binder there may be used hydrophilic (co)polymers such as for example, homopolymers and copolymers of vinyl alcohol, acrylamide, methylol acrylamide, methylol methacrylamide, acrylic acid, methacrylic acid, hydroxyethyl acrylate, hydroxyethyl methacrylate or maleic anhydride/vinylmethylether copolymers.

A cross-linked hydrophilic layer on a flexable support used in accordance with the present embodiment preferably also contains substances that increase the mechanical strength and the porosity of the layer e.g. colloidal silica. In addition inert particles of larger size than the colloidal silica can be added e.g. silica prepared according to Stöber as described in J. Colloid and Interface Sci., Vol. 26, 1968, pages 62 to 69 or alumina particles or particles having an average diameter of at least 100 nm which are particles of titanium dioxide or other heavy metal oxides. Incorporation of these particles gives the surface of the crosslinked hydrophilic layer a uniform rough texture consisting of microscopic hills and valleys.

The thickness of the cross-linked hydrophilic layer may vary in the range of 0.2 to 25 μm and is preferably 1 to 10 μm.

Particular examples of suitable cross-linked hydrophilic layers for use in accordance with the present invention are disclosed in EP-A 601240, GB-P-1419512, FR-P-2300354, U.S. Pat. No. 3,971,660, U.S. Pat. No. 4,284,705 and EP-A 514490.

As flexible support of a crosslinked hydrophilic layer in connection with the present embodiment it is particularly preferred to use a plastic film e.g. substrated polyethylene terephthalate film, cellulose acetate film, polystyrene film, polycarbonate film etc. . . . The plastic film support may be opaque or transparent.

It is particularly preferred to use a polyester film support to which an adhesion improving layer has been provided. Particularly suitable adhesion improving layers for use in accordance with the present invention comprise a hydrophilic binder and colloidal silica as disclosed in EP-A 619524, EP-A 620502 and EP-A 619525.

Preferred supports for the heat-sensitive material used in connection with present invention are supports having an ink-accepting surface e.g. a polyester film support, paper coated with a polyolefin such as polyethylene, polycarbonate film, polystyrene film etc.

In accordance with the present invention, on top of an ink-accepting support there is provided an image forming layer. Optionally, there may be provided one or more intermediate layers between the ink-accepting support and the image forming layer. An image forming layer in connection with the present invention comprises thermoplastic polymer particles preferably dispersed in a hydrophilic binder, Suitable hydrophilic binders for use in an image forming layer in connection with this invention are water soluble (co)polymers for example synthetic homo- or copolymers such as polyvinylalcohol, a poly(meth)acrylic acid, a poly (meth)acrylamide, a polyhydroxyethyl(meth)acrylate, a polyvinylmethylether or natural binders such as gelatin, a polysaccharide such as e.g. dextran, pullulan, cellulose, arabic gum, alginic acid.

The hydrophilic binder can also be a water insoluble, alkali soluble or swellable resin having phenolic hydroxy groups and/or carboxyl groups.

Preferably the water insoluble, alkali soluble or swellable resin used in connection with the present invention comprises phenolic hydroxy groups. Suitable water insoluble, alkali soluble or swellable resins for use in an image forming layer in connection with this invention are for example synthetic novolac resins such as ALNOVOL, a registered trade mark of Reichold Hoechst and DUREZ, a registered trade mark of OxyChem and synthetic polyvinylfenols such as MARUKA LYNCUR M, a registered trade mark of Dyno Cyanamid.

The hydrophilic binder used in connection with the present invention is preferably not cross-linked or only slightly cross-linked.

The thermoplastic polymer particles preferred in the embodiment of this invention are hydrophobic polymer particles. The hydrophobic thermoplastic polymer particles used in connection with the present invention preferably have a coagulation temperature above 35° C. and more preferably above 50° C. Coagulation may result from softening or melting of the thermoplastic polymer particles under the influence of heat. There is no specific upper limit to the coagulation temperature of the thermoplastic hydrophobic polymer particles, however the temperature should be sufficiently below the decomposition of the polymer particles. Preferably the coagulation temperature is at least 10° C. below the temperature at which the decomposition of the polymer particles occurs. When said polymer particles are subjected to a temperature above coagulation temperature they coagulate to form a hydrophobic agglomerate in the hydrophilic layer so that at these parts the hydrophilic layer becomes insoluble in plain water or an aqueous liquid.

Specific examples of hydrophobic polymer particles for use in connection with the present invention are e.g. polyethylene, polyvinyl chloride, polymethyl (meth) acrylate, polyethyl (meth)acrylate, polyvinylidene chloride, polyacrylonitrile, polyvinyl carbazole etc. or copolymers thereof. Most preferably used is polyethylene or polymethyl (meth)acrylate.

The weight average molecular weight of the polymers may range from 5,000 to 1,000,000 g/mol.

The hydrophobic particles may have a particle size from 0.01 μm to 50 μm, more preferably between 0.05 μm and 10 μm and most preferably between 0.05 μm and 2 μm.

The polymer particles are present as a dispersion in the aqueous coating liquid of the image forming layer and may be prepared by the methods disclosed in U.S. Pat. No. 3,476,937. Another method especially suitable for preparing an aqueous dispersion of the thermoplastic polymer particles comprises:

dissolving the hydrophobic thermoplastic polymer in an organic water immiscible solvent, dispersing the thus obtained solution in water or in an aqueous medium and removing the organic solvent by evaporation.

The amount of hydrophobic thermoplastic polymer particles contained in the image forming layer is preferably at least 30% by weight and more preferably at least 45% by weight and most preferably at least 60% by weight.

The image forming layer can also comprise crosslinking agents although this is not necessary. Preferred crosslinking agents are low molecular weight substances comprising a methylol group such as for example melamine-formaldehyde resins, glycoluril-formaldehyde resins, thiourea-formaldehyde resins, guanamine-formaldehyde resins, benzoguanamine-formaldehyde resins. A number of said melamine-formaldehyde resins and glycoluril-formaldehyde resins are commercially available under the trade names of CYMEL (Dyno Cyanamid Co., Ltd.) and NIKALAC (Sanwa Chemical Co., Ltd.).

The imaging element further includes a compound capable of converting light to heat. This compound is preferably comprised in the image forming layer but can also be provided in a layer adjacent to the image forming layer. Suitable compounds capable of converting light into heat are preferably infrared absorbing components although the wavelength of absorption is not of particular importance as long as the absorption of the compound used is in the wavelength range of the light source used for image-wise exposure. Particularly useful compounds are for example dyes and in particular infrared dyes, carbon black, metal carbides, borides, nitrides, carbonitrides, bronze-structured oxides and oxides structurally related to the bronze family but lacking the A component e.g. $WO_{2.9}$. It is also possible to use conductive polymer dispersion such as polypyrrole or polyaniline-based conductive polymer dispersions. The lithographic performance and in particular the print endurance obtained depends on the heat-sensitivity of the imaging element. In this respect it has been found that carbon black yields very good and favorable results.

A light-to-heat converting compound in connection with the present invention is most preferably added to the image forming layer but at least part of the light-to-heat converting compound may also be comprised in a neighbouring layer. Such layer can be for example the cross-linked hydrophilic layer of the ink-accepting support according to the second embodiment of ink-accepting support explained above or the ink-repellant silicone layer.

According to a method in connection with the present invention for obtaining a printing plate, the imaging element is image-wise exposed and subsequently developed by rinsing it with plain water.

In accordance with an alternative method of the present invention the imaging element is image-wise exposed and subsequently mounted on a print cylinder of a printing press. It may be advantageous to wipe the image forming layer of an image-wise exposed imaging element with e.g. a cotton pad or sponge soaked with water before mounting the imaging element on the press before the printing press starts running to remove some non-image forming areas, but this will not actually develop the imaging element.

According to a further method, the imaging element is first mounted on the printing cylinder of the printing press and then image-wise exposed directly on the press. Subsequent to exposure, the imaging element can be developed as described above.

The printing plate of the present invention can also be used in the printing process as a seamless sleeve printing plate. In this option the printing plate is soldered in a cylindrical form by means of a laser. This cylindrical printing plate which has as diameter the diameter of the print cylinder is slided on the print cylinder instead of applying in a classical way a classically formed printing plate. More details on sleeves are given in "Grafisch Niews", 15, 1995, page 4 to 6.

Image-wise exposure in connection with the present invention is preferably an image-wise scanning exposure involving the use of a laser or L.E.D. It is highly preferred in connection with the present invention to use a laser emitting in the infrared (IR) and/or near-infrared, i.e. emitting in the wavelength range 700–1500 nm. Particularly preferred for use in connection with the present invention are laser diodes emitting in the near-infrared.

After the development of an image-wise exposed imaging element with an aqueous alkaline solution and drying the obtained plate can be used as a printing plate as such. However, it is still possible to bake said plate at a temperature between 100° C. and 230° C. for a period of 40 minutes to 5 minutes. For example the exposed and developed plates can be baked at a temperature of 230° C. for 5 minutes, at a temperature of 150° C. for 10 minutes or at a temperature of 120° C. for 30 minutes.

The following examples illustrate the present invention without limiting it thereto. All parts are by weight unless otherwise specified.

EXAMPLE 1

Preparation of the coating composition for the recording layer.

To 175 g of a 20% dispersion of polymethylmethacrylate (particle diameter of 90 $\mu$m) stabilised with Hostapon B (1% vs. polymer) in deionised water was subsequently added, while stirring, 33 g of a 15% dispersion of carbon black containing a wetting agent in water, 582 g water, 200 g of a 5% solution of 98% hydrolysed polyvinylacetate, having a weight average molecular weight of 200,000 g/mol (MOWIOL 56-98 available from Hoechst) in water, and 10 ml of wetting agent.

Preparation of coating for the (ink repellant) top layer.

| | |
|---|---|
| iso-octane | 95 g |
| Vinyl terminated dimethylsiloxane (from Petrarch Systems Inc.) | 48.7 g |
| Vinyl terminated dimethylsiloxane (from Petrarch Systems Inc.) | 1 g |
| Surfinol 61 (inhibitor, from Air products & chemicals) | 0.1 g |
| Pt-catalyst (from ABCR GMBH & Co) | 0.2 g |

Preparation of the imaging element (material)

An imaging element according to the invention was produced by preparing the above coating composition for the infrared recording layer, and coating it onto an aluminum support in an amount of 30 g/m$^2$ (wet coating amount) and drying it at 30° C. To this layer was coated the (ink repellant) top layer from the above described coating solution to a dry coating thickness of 1.9$\mu$. Subsequently the (ink repellant) top layer was dried and cured for al least 16 hours at 70° C.

Preparation of a printing plate and making copies of the original.

An imaging element (material) as described above was subjected to a scanning infra-red laser diode emitting at 830 nm (scanspeed lm/s, spot size 10$\mu$ and 120 mW power on the plate surface).

The exposed plate element was developed by rubbing with a wet cotton pad, removing the unexposed parts entirely from the support.

The obtained printing plate can be used on a conventional offset printing press using a suitable ink. Excellent copies and high printing endurance are obtained.

What is claimed is:

1. A method for obtaining a driographic printing plate comprising the steps of:

a. image-wise or information-wise exposing to light or heat an imaging element wherein said imaging element comprises on a support having an ink-accepting surface an image forming layer, a compound capable of converting light into heat present in said image forming layer or in a layer adjacent thereto and a cured ink-repellant surface layer, wherein said image forming layer comprises hydrophobic thermoplastic polymer particles; and b. developing said exposed imaging element with an aqueous developing solution in order to remove the unexposed areas and thereby form a driographic printing plate.

2. A method for obtaining a driographic printing plate according to claim 1 wherein said image-wise exposed imaging element is developed by wiping with water or an aqueous solution before or after mounting the plate on a print cylinder of a printing press.

3. A method for obtaining a driographic plate according to claim 1 wherein said driographic printing plate formed is a seamless sleeve printing plate.

4. The method according to claim 1 wherein said hydrophobic thermoplastic polymer particles are dispersed in a hydrophilic binder.

5. The method according to claim 4 wherein said hydrophilic binder is a water soluble or swellable (co)polymer.

6. The method according to claim 1 wherein said cured ink-repellant surface layer contains a polysiloxane.

7. The method according to claim 1 wherein the thickness of said surface layer is at least 0.5 μm.

8. The method according to claim 1 wherein the thickness of said image forming layer comprises between 0.1 μm and 2 μm.

9. The method according to claim 1 wherein said thermoplastic particles have a coagulation temperature of at least 35° C.

* * * * *